(12) United States Patent
Su

(10) Patent No.: US 10,280,250 B2
(45) Date of Patent: May 7, 2019

(54) RESIN COMPOSITION, INSULATING MATRIX COMPRISING THE SAME AND CIRCUIT BOARD USING THE SAME

(71) Applicant: Chi-Lan Chang, Taipei (TW)

(72) Inventor: Fu-Hu Su, Taoyuan (TW)

(73) Assignee: Chi-Lan Chang, Taipei (TW)

( * ) Notice: Subject to any disclaimer, the term of this patent is extended or adjusted under 35 U.S.C. 154(b) by 28 days.

(21) Appl. No.: 15/364,365

(22) Filed: Nov. 30, 2016

(65) Prior Publication Data

US 2017/0158805 A1 Jun. 8, 2017

(30) Foreign Application Priority Data

Dec. 4, 2015 (TW) .............................. 104140747 A

(51) Int. Cl.
  *H05K 1/03* (2006.01)
  *C08G 18/64* (2006.01)
  *C08G 18/76* (2006.01)

(52) U.S. Cl.
  CPC ..... *C08G 18/6438* (2013.01); *C08G 18/7671* (2013.01); *H05K 1/0346* (2013.01); *H05K 1/0373* (2013.01); *H05K 1/0393* (2013.01); *H05K 2201/0154* (2013.01); *H05K 2201/05* (2013.01)

(58) Field of Classification Search
  None
  See application file for complete search history.

(56) References Cited

FOREIGN PATENT DOCUMENTS

| JP | 2008255249 A | 10/2008 |
| JP | 2012214670 A | 11/2012 |
| KR | 20130059434 A | 6/2013 |
| KR | 20150114425 A | 10/2015 |
| TW | 201504284 A | 2/2015 |

OTHER PUBLICATIONS

Machine translation of JP 2012214670 (A).*

* cited by examiner

*Primary Examiner* — Ana L. Woodward
(74) *Attorney, Agent, or Firm* — Bacon & Thomas, PLLC

(57) ABSTRACT

A resin composition, an insulating matrix comprising the same and a circuit board using the same. The resin composition of the present invention comprises: a cross-linked polymer formed by a diamine unit containing an imide group, which is represented by the following formula (1), and an isocyanate unit represented by the following formula (2):

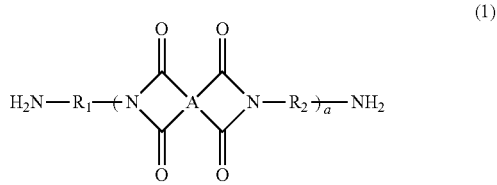

wherein, $R_1$, $R_2$, A, X and a are defined in the specification.

15 Claims, 1 Drawing Sheet

RESIN COMPOSITION, INSULATING MATRIX COMPRISING THE SAME AND CIRCUIT BOARD USING THE SAME

CROSS REFERENCE TO RELATED APPLICATION

This application claims the benefits of the Taiwan Patent Application Serial Number 104140747, filed on Dec. 4, 2015, the subject matter of which is incorporated herein by reference.

BACKGROUND OF THE INVENTION

1. Field of the Invention

The present invention relates to a resin composition, an insulating matrix comprising the same and a circuit board using the same. More specifically, the present invention relates to a resin composition comprising a cross-linked polymer formed by a diamine unit containing an imide group and an isocyanate unit, an insulating matrix comprising the same and a circuit board using the same.

2. Description of Related Art

Flexible circuit boards in which printing circuits are formed on flexible substrates are usually applied to various electronic devices. These flexible circuit boards comprise substrates, circuits formed on the substrates and insulating matrix for protecting the circuits.

The substrates or the insulating matrix used in these flexible circuit boards can be formed by thermal stable resin films formed by polyimide. Among the known polyimide, aryl polyimide not only has excellent thermal stability, mechanical property and flame retardancy, but also has excellent size stability. There are the reasons why the aryl polyimide can be applied to various fields. However, the polyimide sometimes is difficult to be dissolved in solvents and has higher melting point, resulting in the workability thereof reduced.

The portable phones are nowadays developed from the folding or slider phones toward the smart phones, based on advantages of large screens, thin thicknesses, delicate designs and internet functions. Applications of these advantages are even expanded, for example, portable display devices called as pads are continuously developed and upgraded inherently connected to improvement of screens and relative techniques. The demands of the display devices with more functions and small sizes cause many stricter requirements to their inside units, such as thinner thicknesses of the flexible circuit boards as well as other units. Because the flexible circuit boards are designed to deploy circuit lines, their thicknesses, flexibility and toughness are very important and have to be improved for new designs and new display devices.

Epoxy adhesive is generally used as an adhesive of the protection layer, compared with a polyimide layer and an epoxy resin layer; the protection layer adheres onto a substrate with circuits on its surface to form the flexible circuit board. However, aryl polyimide is rigid and does not have enough flexibility; and the used adhesive causes the thickness of the circuit board hard to be reduced. In some cases, thin polyimide layer is prepared to be thinner products to solve the thickness problem; but the yield of the circuit board is not good enough. In other cases, single protection layer may be formed by alloy resin of epoxy or polyimide and acrylic resin, or alloy resin of epoxy resin derived from rubber and acrylic resin; but the technique for embedding circuits into the aforesaid protection layer are not matured and the thermal stability of the obtained circuit boards is not good enough.

Therefore, it is desirable to provide a novel resin composition, and the products thereof can show excellent toughness, flexibility, film workability, thermal stability and adhesion, to solve the aforementioned problems.

SUMMARY OF THE INVENTION

An object of the present invention is to provide a resin composition, and an insulating matrix and a circuit board comprising the resin composition. The resin composition comprises a cross-linked polymer formed by a diamine unit containing an imide group and an isocyanate unit. The film formed by this resin composition has excellent toughness, flexibility, film workability, thermal stability and adhesion; therefore, the resin composition is suitable for substrates, and adhesion layers, insulating layers and protection layers of circuit boards.

The resin composition of the present invention comprises a cross-linked polymer formed by a diamine unit containing an imide group represented by the following formula (1) and an isocyanate unit represented by the following formula (2):

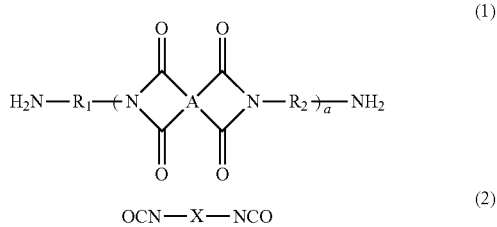

wherein,
each of $R_1$ and $R_2$ independently is a $C_{1-60}$ aliphatic group, a $C_{4-20}$ alicyclic group, a $C_{6-60}$ aryl group, a $C_{4-20}$ heterocyclic group, or a $C_{4-60}$ heteroaryl group;
A is a $C_{6-60}$ aryl group, or a $C_{4-60}$ heteroaryl group;
X is a $C_{1-60}$ aliphatic group, a $C_{4-20}$ alicyclic group, or a $C_{5-60}$ aryl group; and
a is an integral between 1 and 100.

In the aforesaid cross-linked polymer, a molar ratio of the unit of the formula (1) and the unit of the formula (2) is not particularly limited, and can be adjusted according to its application. For example, when the units of the formulas (1) and (2) are used to form the cross-linked polymer, a molar ratio of the NH group in the diamine unit containing the imide group to the OCN group in the isocyanate unit is between 1:0.31 to 1:0.95; in this case, in the formed cross-linked polymer a molar ratio of the unit of the formula (1) to the unit of the formula (2) is ranged from 1:0.31 to 1:0.95, and preferably from 1:0.51 to 1:0.85.

In the aforesaid molar ratio of the NH group in the diamine unit of the formula (1) to the OCN group in the isocyanate unit of the formula (2), the cross-linking process is hard to be performed and it is difficult to obtain the target cross-linked polymer when the ratio of the isocyanate unit is less than 0.31. If the ratio of the isocyanate unit is more than 0.95, the crosslinking degree of the cross-linked polymer is too high, resulting in the amount of unsoluble substances too much; therefore, the flowability of the obtained cross-linked polymer is decreased.

In the present invention, the diamine unit of the formula (1) comprises imide group and a certain amount of aliphatic groups or aryl groups. When the diamine unit of the formula (1) is reacted with the isocyanate unit of the formula (2) through ureido synthesis, allophanate synthesis or biuret synthesis to obtain a cross-linked polymer with certain crosslinking degree and high molecular weight, the formed cross-linked polymer has excellent toughness, flexibility, film workability, thermal stability and adhesion. Hence, when the cross-linked polymer of the present invention is used as an insulating matrix or as adhesion layers or protection layers for circuit boards, the obtained products can show excellent flexibility, bendability and thermal stability. Therefore, flexible thin circuit boards or multi-layered circuit boards with excellent properties can be obtained.

In the present invention, the solvent used in the cross-linking reaction is capable of comprising, for example, polar solvents such as N,N-Dimethyl fumarate (DMF), N,N-dimethylacetamide (DMAc), N-Methyl-2-pyrrolidone (NMP), tetrahydrofuran (THF), diethylene glycol dimethyl ether, diethylene glycol diethyl ether, diethylene glycol dipropyl ether, diethylene glycol ethyl methyl ether, diethylene glycol dimethyl ether, diethylene glycol diethyl ether, dipropylene glycol dimethyl ether, dipropylene glycol diethyl ether, dipropylene glycol methyl ether, cyclopentanone, cyclohexanone, 1,4-dioxane, dimethyl sulfoxide (DMSO), methyl isobutyl ketone, methyl cellulose acetate, ethyl cellulose acetate, propyl cellosolve, butyl cellosolve, dipropylene glycol monomethyl ether acetate, dipropylene glycol monoethyl ether acetate, and dipropylene glycol monopropyl ether acetate; or non-polar solvents such as toluene, xylene, mesitylene, and solvent naphtha. Herein, the aforesaid solvent can be used alone or in combination. When the polar solvent and the non-polar solvent are combined, the ratio therebetween is not particularly limited, as long as the mixing solvent does not influence the solubility of the resin. Preferably, in the mixing solvent comprising the polar solvent and the non-polar solvent, a content of the non-polar solvent is 60 wt % or less based on a total weight of the mixing solvent; more preferably, 50 wt % or less; and most preferably, 49 wt % or less. When the content of the non-polar solvent in the mixing solvent is more than 60 wt %, the property of the solvent to dissolve components is decreased, and it is difficult to increase the crosslinking degree of the cross-linked polymer.

In the present invention, the diamine unit of the formula (1) is an oligomer or a polymer formed by a tetracarboxylic dianhydride monomer and a diamine monomer. Herein, a molar ratio of the tetracarboxylic dianhydride monomer to the diamine monomer is not particularly limited, and can be adjusted according to its application. For example, when the tetracarboxylic dianhydride monomer and the diamine monomer react to form the oligomer or the polymer represented by the formula (1), the molar ratio of the COOH group in the tetracarboxylic dianhydride monomer to the NH group in the diamine monomer can be ranged from 1:1.05 to 1:2. Hence, in the formed diamine unit of the formula (1), the molar ratio of the tetracarboxylic dianhydride monomer to the diamine monomer can be ranged from 1:1.05 to 1:2.

In the present invention, the synthesis of the diamine unit of the formula (1) with the imide group is performed by simultaneously mixing the tetracarboxylic dianhydride monomer and the diamine monomer in the aforesaid solvent. If the diamine monomer is liquid, the diamine monomer is added dropwise into the solution in a period of more than 30 min, and preferably 1 hour to 10 hours, to prevent rapid heating caused by the reaction. In addition, the reaction temperature is based on types of used polar solvent and non-polar solvent, mixing ratios, and azeotropy temperature.

The azeotropy temperature is preferably 100-230° C., more preferably 130-200° C., and most preferably 150-180° C. If the reaction temperature is too high, side effects between starting materials may easily occur; and in this case, the crosslinking between starting materials cannot be controlled, resulting in the product colloidized. If the reaction temperature is too low, the imidization reaction cannot complete easily; therefore, it is difficult to obtain polyimide comprising imide groups to have high stability and enough molecular weight. Furthermore, the reaction time also depends upon the starting materials and the solvents. The reaction time is preferably 2-10 hours, more preferably 3-8 hours, and most preferably 4-6 hours. In addition, in the synthesis for the diamine unit comprising the imide groups, catalysts and/or condensation agents may be selectively added therein; and preferably, no catalyst is added.

In the diamine unit of the formula (1) in the cross-linked polymer of the present invention, each of $R_1$ and $R_2$ independently is a $C_{1-60}$ aliphatic group, a $C_{4-20}$ alicyclic group, a $C_{6-60}$ aryl group, a $C_{4-20}$ heterocyclic group, or a $C_{4-60}$ heteroaryl group; and A is a $C_{6-60}$ aryl group, or a $C_{4-60}$ heteroaryl group. In one embodiment of the present invention, preferably each of $R_1$ and $R_2$ independently is linear or branch $C_{1-20}$ alkylene, more preferably linear or branch $C_{1-12}$ alkylene, and most preferably linear or branch $C_{1-6}$ alkylene. Examples of $R_1$ and $R_2$ include, but are not limited to, methylene, tetramethylene or pentamethylene. In addition, in another embodiment of the present invention, preferably each of $R_1$ and $R_2$ independently is a $C_{4-20}$ alicyclic group, which can be monocyclic, polycyclic or cross-linked cyclic.

In the diamine unit of the formula (1) of the present invention, each of $R_1$ and $R_2$ independently is $C_{1-12}$ alkylene, $C_{1-12}$ alkenylene, $C_{4-12}$ cycloalkylene, $C_{4-12}$ cycloalkenylene,

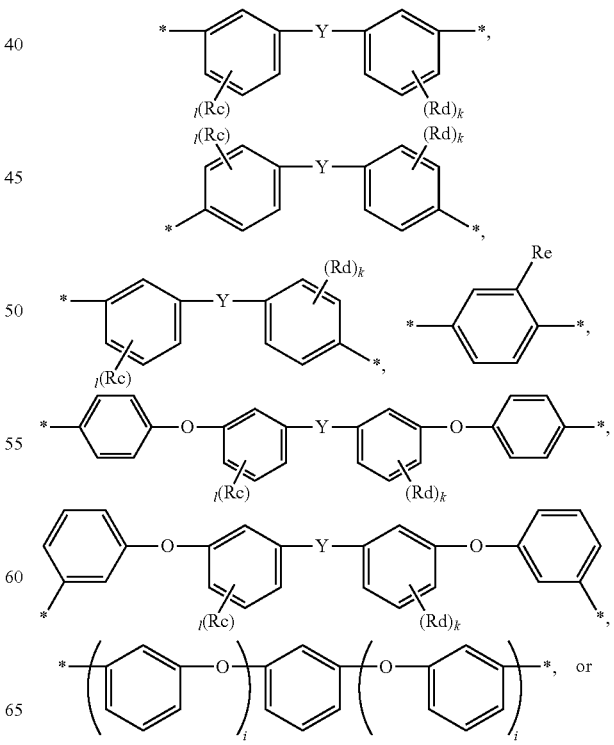

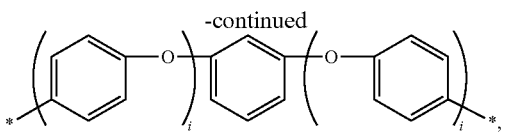

wherein,

Y is a direct bond, —O—, —(CH$_2$)$_j$—O—(CH$_2$)—, C$_{1-6}$ alkylene, —C(=O)—NH—, —C(=O)—, or —S(=O)$_2$—;

each of Rc and Rd independently is C$_{1-10}$ alkyl, C$_{1-10}$ alkoxy, or C$_{1-6}$ carbalkoxy;

Re is carboxyl or —C(=O)O—Rf, in which Rf is tetrahydrofurfuryl, oxyethylene, or epoxypropyl;

each of l and k independently is an integral between 0 and 4;

each of i and j independently is 1 or 2; and

* represents a position linking to N.

Preferably, R$_1$ and R$_2$ are the same.

In the diamine unit of the formula (1) of the present invention, A can be a C$_{6-60}$ aryl group, or a C$_{4-60}$ heteroaryl group. Preferably, A is selected from the group consisting of:

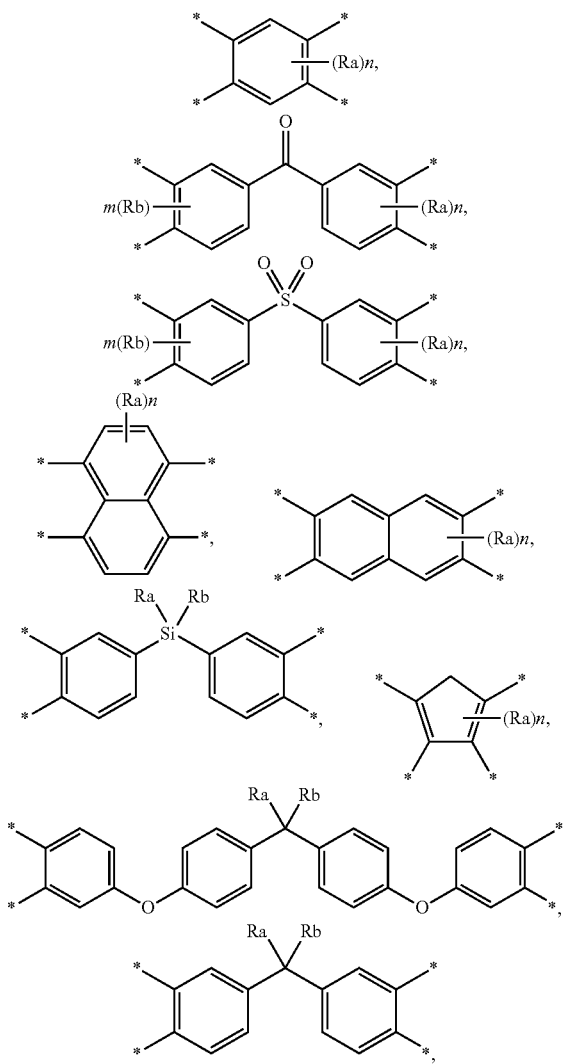

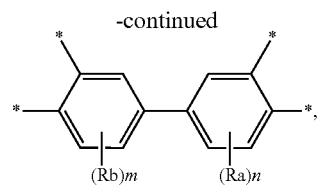

wherein, each of Ra and Rb independently is C$_{1-10}$ alkyl, C$_{1-5}$ carbalkoxy, halo, amino, C$_{3-10}$ cycloalkyl, C$_{6-10}$ aryl or C$_{5-10}$ heteroaryl;

each of in and n independently is an integral between 0 and 4; and

* represents linking positions of A.

In the synthesis of the diamine unit including the imide group of the formula (1), examples of the tetracarboxylic dianhydride monomer include, but are not limited to, pyromellitic dianhydride, 3,3,4,4'-benzophenone tetracarboxylic dianhydride, 3,3,4,4'-diphenylsulfone tetracarboxylic dianhydride, 1,4,5,8-naphthalene tetracarboxylic dianhydride, 2,3,6,7-naphthalene tetracarboxylic dianhydride, 4,4'-benzenedicarboxylic anhydride, 3,3',4,4'-dimethyleter diphenylsilane tetracarboxylic dianhydride, 3,3',4,4'-tetraphenylsilane tetracarboxylic dianhydride, 1,2,3,4-furan tetracarboxylic dianhydride, 4,4'-bis(3,4-dicarboxy phenoxy)diphenyl propane dianhydride, 4,4'-hexafluoro isopropylene benzenedicarboxylic anhydride, 3,3',4,4'-biphenyltetracarboxylic dianhydride, 2,3,3',4'-biphenyltetracarboxylic dianhydride, p-pheylene(trimellitic annydride), or p-phenylenediamine phthalic anhydride.

In the synthesis of the diamine unit including the imide group of the formula (1), the types of the diamine monomers are not particularly limited, and can be divalent organic ligands of C$_{1-60}$ aryl groups, aliphatic groups or alicyclic groups. Herein, examples of the diamine unit being an aryl diamine include, but are not limited to, 3,3'-aminodiphenyl ether, 4,4'-diamino-3,3',5,5'-tetramethyl diphenyl methane, 4,4'-diamino-3,3'-diethyl-5,5'-dimethyl diphenyl methane, 4,4'-diamino diphenyl-2,2'-propane, 4,4'-diamino diphenyl methane, 3,4'-diamino benzoyl aniline, 4,4'-diamino benzoyl aniline, 3,3'-diamino benzophenone, 4,4'-diamino benzophenone, 3,3'-diethyl-4,4'-diamino diphenylether, 3,3'-diethoxy-4,4'-diamino diphenyl methane, 3,3'-dimethyl ester-4,4'-diamino diphenyl methane, 3,3'-dimethyl ester-4,4'-diamino diphenyl propane, 3,3'-diethyl-4,4'-diamino diphenyl propane, 3,3'-dimethyl ester-5,5'-diethyl-4,4'-diamino diphenyl methane, 3,3'-dimethoxy-4,4'-diamino diphenylether, 3,3'-dimethxy-4,4'-diamino diphenyl methane, 3,3'-dimethoxy-4,4'-diamino diphenylsulfone, 3,3'-dimethoxy-4,4'-diamino diphenyl propane, 3,3'-diethoxy-4,4'-diamino diphenyl propane, 3,3',5,5'-tetraethyl-4,4'-diamino diphenyl methane, polytetrahydrofuran-di-P-amino benzoic acid, poly(ethylene oxide)-di-p-amino benzoic acid, poly (propylene oxide)-di-p-amino benzoic acid, 4,4'-bis(3-amino phenoxy)biphenyl, 4,4'-bis(4-amino phenoxy)biphenyl, 1,3-bis(3-amino phenozy)benzene, 1,3-bis(4-amino phenoxy)benzene, 1,4-bis(4-amino phenoxy)benzene, 1,3-bis[3-(amino phenoxy)phenoxy]benzene, bis[4-(4-amino phenoxy)phenyl]ether, and 2,2'-bis[4-(4-amino phenoxy) phenyl]propane.

In addition, in the isocyanate unit of the formula (2) of the present invention, X can be selected from the group consisting of $C_{4-18}$ alkylene, $C_{8-22}$ cycloalkylene, $C_{8-22}$ cycloalkenylene, $C_{6-18}$ arylene, and —($C_{1-4}$ alkyl)-$C_{5-18}$ arylene-($C_{1-4}$ alkyl)-.

In the cross-linked polymer of the present invention, the isocyanate unit of the formula (2) of the present invention can be aryl diisocyanate, aliphatic diisocyanate or alicyclic diisocyanate. Examples of the aryl diisocyanate include, but are not limited to, toluene diisocyanate (TDI), 4,4-Methylenebis(phenyl isocyanate) (MDI), naphthyl diisocyanate (NDI), 3,3'-dimethylbiphenyl-4,4-diisocyanate (TODI), o-xylylene diisocyanate, m-xylylene diisocyanate, or p-xylylene diisocyanate. In addition, aliphatic diisocyanate and alicyclic diisocyanate are compounds with isocyanate groups bonding with alkylene (such as methylene), alkylidene (such as methylidene) or isocarbalkoxy (such as isopropanolate). Wherein, when aliphatic diisocyanate does not comprise aryl group, the aliphatic diisocyanate preferably is $C_{4-18}$ aliphatic diisocyanate, more preferably $C_{5-14}$ aliphatic diisocyanate, and most preferably $C_{6-12}$ aliphatic diisocyanate. When the aliphatic diisocyanate comprises aryl group, the aliphatic diisocyanate preferably is $C_{8-22}$ aliphatic diisocyanate, more preferably $C_{8-18}$ aliphatic diisocyanate, and most preferably $C_{8-16}$ aliphatic diisocyanate. Furthermore, the alicyclic diisocyanate preferably is $C_{8-22}$ alicyclic diisocyanate, more preferably $C_{8-18}$ alicyclic diisocyanate, and most preferably $C_{8-16}$ alicyclic diisocyanate.

Herein, examples of the aliphatic diisocyanate and alicyclic diisocyanate include, but are not limited to, the tetramethylene diisocyanate, pentamethylene diisocyanate, hexamethylene diisocyanate (HDI), 2,2,4-trimethyl-1,6-diisocyanatohexane, 2,4,4-trimethyl-1,6-diisocyanatohexane, lysine methyl ester diisocyanate (LDI), isophorone diisocyanate (IPDI), 1,4-diisocyanatohexane, 1,3-bis(methyl isocyanate)-hexane, 1,4-bis(methyl isocyanate)-hexane, 1,3-bis(2-propyl isocyanate-2-yl)-hexane, 4,4-dicyclohexyl diisocyanate, norbornene dimethyl ester diisocyanate, norbornene diisocyanate, tetramethyl xylyl diisocyanate, and xylylene diisocyanate.

In addition, the cross-linked polymer of the present invention may selectively further comprises repeated unit derived from dimer diamine. Herein, residues on the dimer diamine are not particularly limited, and the dimer diamine can be $C_{24-48}$ dimer diamine. In the present invention, two carboxyl groups of poly fatty acids are imidized and then reduced to obtain dimer diamine. Herein, one or more $C_{10-24}$ basic unsaturated fatty acid with a double bond or a triple bond undergoes Diels-Alder reaction to obtain a poly fatty acid. In one example of the present invention, soybean oil fatty acid, tall oil fatty acid, canola oil fatty acid, rice bran oil fatty acid, heliotrope oil fatty acid, and cotton seed oil fatty acid obtained from hydrolysis of plant or vegetable oils, and oleic acid, linoleic acid and erucic acid refined from the aforesaid oils are used as a materials, and undergoes Diels-Alder reaction to obtain a poly fatty acid. Except for the aforesaid $C_{24-48}$ dimer diamine derived from the poly fatty acid, the dimer diamine can be polyoxyethylene bis(amine), polyoxypropylene bis(amine), polyoxybutylene bis(amine), a block copolymer of polyethylene glycol and polyoxyethylene bis (amine), a block copolymer of polyethylene glycol and poly(diamine tetramethylene glycol), a block copolymer of polypropylene glycol diamine and polybutylene glycol diamine, and a block copolymer of polyethylene glycol diamine, polypropylene glycol diamine and polybutylene glycol diamine.

Furthermore, in the cross-linked polymer of the present invention, when each of $R_1$ and $R_2$ independently is a substituted or unsubstituted $C_{1-60}$ aliphatic group, a content of the unit of the formula (1) is 20-90 wt % and preferably 35-80 wt % based on a total molecular weight of the cross-linked polymer; and a tensile modulus of the cross-linked polymer is 0.1-2.0 GPa and preferably 0.3-1.5 GPa at room temperature. In addition, when each of $R_1$ and $R_2$ independently is a substituted or unsubstituted $C_{6-60}$ aryl group, a content of the unit of the formula (1) is 10-80 wt % and preferably 20-65 wt % based on a total molecular weight of the cross-linked polymer; and a tensile modulus of the cross-linked polymer is 0.1-2.0 GPa and preferably 0.3-1.5 GPa at room temperature. If the tensile modulus of the cross-linked polymer at room temperature is less than 0.1 GPa, the initial viscosity at room temperature is unfavorable, the thermal resistance of the obtained product during the welding process is reduced, and the toughness of the obtained product is deteriorated. Furthermore, if the tensile modulus of the cross-linked polymer at room temperature is more than 2.0 GPa, the bending of the obtained product may be occurred during the manufacturing process, or the desired flexible thereof cannot be obtained.

In the present invention, the Tg of the cross-linked polymer is preferably 80° C. or less, more preferably 60° C. or less, and most preferably between 20° C. and 40° C. If the Tg of the cross-linked polymer is more than 80° C., the softening temperature of the resin composition is increased, and the temperature for laminating dry films is also increased.

In addition, the 1% weight loss temperature of the cross-linked polymer of the present invention is 320° C. or more. If the 1% weight loss temperature is less than 320° C., swelling between the insulating layers and the circuit board is easily occurred when units are amounted on the circuit board.

In the resin composition of the present invention, alkyl, alkylene, alkoxy, alkenyl, cycloalkyl, cycloalkylene, cycloalkenylene, carbalkoxy, amino, aryl, arylene, and heteroaryl can be selectively substituted or unsubstituted with a substituent. The substituent can be alkyl, cycloalkyl, halo, alkoxy, alkenyl, a heterocyclic group, aryl, ester, amino or carboxyl; with the proviso that the alkyl is not substituted with alkyl.

In the present invention, the term "halo" includes F, Cl, Br and I; preferably F, Cl or Br; and more preferably Cl or Br. The term "alkyl(ene)" includes linear or branch alkyl(ene); preferably linear or branch $C_{1-20}$ alkyl(ene); more preferably linear or branch $C_{1-12}$ alkyl(ene); and most preferably linear or branch $C_{1-6}$ alkyl(ene). Examples of the alkyl(ene) include, but are not limited to, methyl(ene), ethyl(ene), n-propyl(ene), isopropyl(ene), n-butyl(ene), iso-butyl(ene), sec-butyl(ene), tert-butyl(ene), n-pentyl(ene), neo-pentyl (ene) or hexyl(ene). The term "alkyl(ene)oxy" refers to a group that the aforesaid alkyl(ene) coupled with an oxygen atom; preferably includes linear or branch $C_{1-20}$ alkyl(ene) oxy; more preferably includes linear or branch $C_{1-12}$ alkyl (ene)oxy; and most preferably includes linear or branch $C_{1-6}$ alkyl(ene)oxy. Examples of the alkyl(ene)oxy include, but are not limited to methyl(ene)oxy, ethyl(ene)oxy, n-propyl (ene)oxy, isopropyl(ene)oxy, n-butyl(ene)oxy, iso-butyl (ene)oxy, sec-butyl(ene)oxy, tert-butyl(ene)oxy, n-pentyl (ene)oxy, neo-pentyl(ene)oxy or hexyl(ene)oxy. The term "alkenyl(ene)" includes linear or branch hydrocarbon groups with at least one double bond; preferably linear or branch $C_{2-20}$ hydrocarbon groups with at least one double bond; more preferably linear or branch $C_{2-12}$ hydrocarbon groups with at least one double bond; and most preferably linear or branch $C_{2-6}$ hydrocarbon groups with at least one double bond. Examples of the alkenyl(ene) include, but are not limited to vinyl(ene), propenyl(ene) or butenyl(ene). The term "aryl(ene)" includes 6-membered single aromatic ring, 10-membered double aromatic ring or 14-membered triple aromatic ring. Example of the aryl(ene) includes, but are not limited to phenyl(ene), naphthyl(ene), pyrenyl(ene), anthryl (ene) or phenanthryl(ene); and preferably is phenyl(ene). The term "heterocyclic group" includes hetero aromatic functional group (i.e. heteroary) and heterocycloalkyl group having 5-8 membered single ring, 8-12 membered double ring or 11-14 membered triple ring and at least one hetero atom, in which each hetero atom in the ring is selected from O, S and N. Herein, examples of the heteroary include, but are not limited to pyridyl, pyrimidinyl, furyl, thiazolyl, imidazolyl, or thienyl. The term "cycloalkyl(ene)" includes cyclic saturated hydrocarbon groups, which includes 3 to 30 carbon atoms (for example, $C_3$-$C_{12}$). Examples of the cycloalkyl(ene) include, but are not limited to cyclopropyl (ene), cyclobutyl(ene), cyclopentyl(ene), cyclohexyl(ene), 1,4-cyclohexyl, cycleheptyl(ene), cyclooctyl(ene) or adamantine. The term "cycloalkenyl(ene)" includes cyclic unsaturated hydrocarbon groups, which includes 3 to 30 carbon atoms (for example, $C_3$-$C_{12}$) and one or more double bond. Examples of the cycloalkenyl(ene) include, but are not limited to cyclopentenyl(ene), cyclohexenyl(ene) or cycloheptenyl(ene). The term "carbalkoxy" refers to a linear or branch alkyl group linked with —C(═O)O—; preferably is a linear or branch $C_{1-6}$ alkyl group linked with —C(═O)O—; and more preferably is a linear or branch $C_{1-3}$ alkyl group linked with —C(═O)O—. Examples of the carbalkoxy include, but are not limited to carbomethoxy, carboethoxy, carbopropyloxy or carbobutyloxy.

In addition, in the resin composition of the present invention, as long as the effect of the resin composition is not deteriorated, other component generally used in the art can be added into the resin composition of the present invention, for example, fillers, retardants, antioxidants, defoamers or leveling agents.

Examples of the fillers include, but are not limited to inorganic fillers such as borazon, aluminum nitride, hydrated aluminum, silicon oxide, silicon nitride, silicon carbide, diamond, hydroxyapatite, barium tatanate, aluminum hydroxide, magnesium hydroxide, calcium carbonate, magnesium carbonate, barium sulfate, magnesium sulfate, aluminum silicate, zirconium silicate, titanium oxide, zinc oxide, kaolin, ralc, asbestos powders, quartz powders, mica powders, or glass fibers; or organic fillers such as polyethylene powders, polypropylene powders, polyvinyl chloride powders, polystyrene powders, poly(vinyl acetate) powders, powders of a copolymer of polystyrene and vinyl acetate, poly(methyl methacrylate) powders, polyurethance powders, polyesters powders, urea resin powders, phenolic resin powders, or epoxy resin powders. Herein, metal hydroxide is preferable because it can be used as a retardant aids. The adding amount of the fillers is not particularly limited, and can be adjusted according to the types of the fillers and the applications of the resin composition of the present invention. On the basis of 100 parts by weight of the resin composition of the present invention, the adding amount of the filler is preferably 0-200 parts by weight, and more preferably 0-150 parts by weight. When the adding amount of the filler is more than 150 parts by weight, the viscosity of the resin composition before forming a film is increased, and therefore the coating property thereof is decreased. In addition, the flexibility of the obtained film may also be decreased; and therefore it is difficult to prepare a flexible circuit board.

In addition, retardants suitable for the resin composition of the present invention include, but are not limited to halo-containing compounds, phosphorus-containing compounds or inorganic retardants, in which the retardants preferably are phosphorus-containing compounds. When the phosphorus-containing compound is used as a retardant and the resin composition does not contain any halo atoms, the obtained resin composition can show better workability and the film obtained from the resin composition has better flexibility. Besides, when the phosphorous-containing compound as the retardant and the metal hydroxide as the filler are used together, the property of the resin composition can be easily balanced. The adding amount of the retardant is not particularly limited, and can be adjusted according to the types of the retardant and the applications of the resin composition of the present invention. When the phosphorous-containing compound is used as the retardant, the content of the phosphorous atom is preferably 0.1-4.0 parts by weight based on 100 parts by weight of the resin composition of the present invention.

In addition, the resin composition of the present invention may selectively further comprise other additives such as coupling agents, defoaming agents, leveling agents or surfactants.

Except for the aforesaid resin composition, the present invention further provides an insulating matrix comprising the aforesaid resin composition. Preferably, the insulating matrix is present in a film shape.

In addition, the present invention further provides a circuit board, comprising: a substrate; and an insulating layer disposed on the substrate. Herein, the circuit board may further comprise a circuit layer disposed between the substrate and the insulating layer.

When the insulating matrix and the circuit board of the present invention comprises the film prepared by the resin composition of the present invention, the insulating matrix and the circuit board can show excellent toughness, flexibility, film workability, thermal stability and adhesion. Hence, the insulating matrix prepared by the resin composition of the present invention can be used as a material for a substrate, a protection layer, an adhesion layer or an insulating layer of a flexible thin circuit board or a multi-layered circuit board. Therefore, the flexible thin circuit board or the multi-layered circuit board with excellent flexibility, bending property or thermal stability can be provided.

In addition, the film prepared by the resin composition of the present invention can be laminated on the circuit board without using any adhesion layer; therefore, the thickness of the obtained circuit board can be thinner. Furthermore, the film prepared by the resin composition of the present invention has excellent workability, so a punching process can be performed on the film. Hence, the film prepared by the resin composition of the present invention can be used as insulating films for circuits of various circuit boards. Additionally, the resin composition of the present invention also has excellent thermal stability, and can be applied to any insulating matrix which should have the property of resisting reflow soldering. When the insulating matrix prepared by the resin composition of the present invention is adhered onto the circuit board, the film shape can be maintained without performing any cutting process. Hence, printing circuit board or multi-layer circuit boards with excellent reliability can be provided.

In the method for preparing a circuit board of the present invention can comprise: coating a support with the resin composition of the present invention to form a dry film of an insulating matrix, and applying the dry film on the printing circuit board. The aforesaid dry film can be formed on the support with single layer or double layer, to form a double or triple layered structure. Alternatively, the aforesaid dry film can also be used as a protection layer of the support. However, the present invention is not limited thereto.

The thickness of the thin film formed by the resin composition of the present invention can be controlled according to its application. Preferably, the thickness is 3-100 μm, more preferably 5-60 μm, and most preferably 7-50 μm. When the thin film is used as an insulating matrix and the thickness thereof is within the aforementioned range, the insulating property and the flexibility thereof can be remained.

The aforesaid support belongs to resin matrix. The resin matrix can be, for example, low density polyethylene, high density polyethylene, polypropylene, polyester, polyethylene terephthalate, polycarbonate, polyarylate, or a copolymer of ethylene and cyclic olefin. The thickness of the resin matrix can be 10-200 μm, preferably 15-100 μm, and more preferably 20-75 μm. When the thickness of the resin matrix is within the aforementioned range, coating property and workability of the resin composition can be remained.

The aforesaid support is generally called as a release film or a release paper; and can be easily released after use. Hence, the adhesion between the release film or the release paper and the insulating matrix prepared by the resin composition of the present invention is preferably less than the adhesion between the circuit board and the insulating matrix. The resin for forming the release film is preferably a copolymer of ethylene and cyclic olefin, polyethylene, polyethylene terephthalate, poly(ethylene naphthalate), or polypropylene. If the adhesion between the release film and the insulating matrix is too large, the surface thereof is preferably coated with release agents. In addition, the adhesion between the insulating matrix and the paper is generally large, and the resin composition may easily penetrate through the paper. Hence, when the release paper is used, a filler layer or a releasing agent can be formed on the release paper. Furthermore, the thickness of the release film or the release paper is not particularly limited, as long as the adhesion balance between the release film or the release paper and the insulating matrix can be maintained. For example, the thickness of the release film or the release paper is 5-100 μm.

In the present invention, the dry film can be prepared by any process known in the art. For example, the resin composition of the present invention can be firstly diluted with a solvent, and a solid content thereof is adjusted to be 10-80 wt %. Then, the mixture is applied on the resin matrix with a certain thickness, followed by drying to obtain a dry film of the insulating matrix.

Herein, the solvent used to dilute the resin composition is not particularly limited, as long as the solubility and the desiccation of the resin can be maintained. The resin composition can be applied on a substrate by any process known in the art, such as reverse roll coating, gravure coating, comma coating or curtain coating. The film can be dried with a hot air dryer, or a far or near infra-red dryer; the drying temperature can be 0-150° C., and preferably is 100-130° C.; and the drying time is 1-30 min.

When the circuit board further comprises a circuit layer disposed between the substrate and the insulating layer, the circuit layer on the printing circuit board can be a metal layer formed on a substrate (for example, a polyimide (PI) substrate); and other layers may be disposed on the substrate if it is necessary. Herein, the PI substrate can be commercially available non-thermal cured PI film; and the thickness thereof can be 3-75 μm, and preferably is 5-40 μm. In addition, the surface of the PI film can be treated with plasma or corona discharge. Furthermore, the material for the metal layer can be selected from the group consisting of Cu, Cu alloys, stainless steel, stainless steel alloys, Ni, Ni alloy (also comprising 42 alloys), Al and Al alloys; and an electroplating treatment may be performed thereon if it is necessary. In the present invention, the metal layer can be formed by a metal foil is adhered on an insulating layer, or by through spraying or deposition on the substrate. Herein, the thickness of the metal layer for the circuit layer is not particularly limited, as long as the metal layer is not broken. Preferably, the thickness of the metal layer is 0.1-300 μm; and more preferably 3-200 μm.

When the insulating matrix of the present invention is laminated on the printing circuit board, the insulating matrix for the dry film is laminated on the circuit layer of the printing circuit board, followed by a press process, to laminate the insulating layer on the circuit layer. The press process is not particularly limited, and can be a flat press process or a roll press process. Most preferably, the press process is a vacuum laminating process. In addition, the circuit layer is preferably embedded into the insulating layer. Meanwhile, after the adhering process, the resin support is separated from the dry film to form the circuit board of the present invention.

In addition, a heat treatment may further be performed, to cure the insulating layer laminated on the circuit board. Therefore, the protection on the circuit layer on the circuit board can further be improved. Herein, the temperature for the heat treatment can be 130-250° C., and preferably 150-200° C. The time for the heat treatment can be 0.5-5 hr. The heat treatment can be performed continuously or steps by steps.

Furthermore, when the insulating matrix is used to form the insulating film between layers of the multi-layered circuit board, one of the printing circuit board is firstly laminated on the dry film of the insulating matrix, the resin matrix is separated, and then another printing circuit board is laminated on the insulating matrix. After thermal pressing process, a multi-layered circuit board with laminated printing circuit board/insulating matrix/printing circuit board can be obtained. In addition, a punching process may be performed on the insulating matrix in advance if a through hole is desired to form in the insulating matrix. If more printing circuit boards are laminated, the printing circuit boards and the insulating matrix can be laminated through multi-steps, heated and pressed simultaneously, and perform heat pressing process at a certain temperature or a certain period steps by steps. Alternatively, the aforementioned process can be repeated.

Other objects, advantages, and novel features of the invention will become more apparent from the following detailed description when taken in conjunction with the accompanying drawings.

DETAILED DESCRIPTION OF THE PREFERRED EMBODIMENT

Figure 1A:
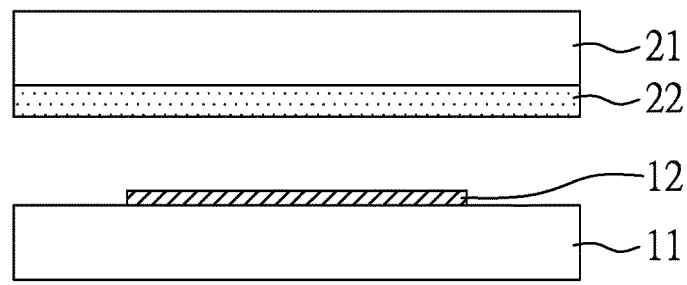
FIGS. 1A to 1C are perspective views showing a preparing process for a circuit board according to Embodiment 6 of the present invention.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

The materials used in the present invention are listed in the following Table 1. The components of the compositions in the following embodiments are listed in the following Table 2. The results are listed in the following Table 3.

[Method for Preparing Dry Film]

Thin films of resin compositions used in the following embodiments of the present invention were prepared by the following steps. First, a PET support film with A4 size was provided, a release treatment was performed on a surface thereof, and a thickness thereof was 50 μm. Next, a formulated varnish with the components shown in Table 1 was applied onto the PET support film through a slit coating machine with 300 μm slits, followed by placing in an ovan at 120° C. for 30 min, to obtain a thin film of the resin compositions with a thickness of 50±2 μm.

[Dynamic Viscosity (η)]

For the control group, dimethyl acetamide for diluting a polymer solution was placed into Ubbelohde viscometer (in which dynamic viscosity ranges between 2 cSt and 10 cSt (C=0.00982)) and between mark lines thereof. Then, the Ubbelohde viscometer was placed in the thermostatic bath at 35° C. for 10 min. Among the three glass tubes, the rubber tube and the string clip were mounted on the glass tube with medium diameter, and the adsorption means was mounted on the finest glass tube. The rubber tube mounted with the string clip was closed, and then the liquid was sucked by the adsorption means. When the liquid was sucked and reached the topmost reservoir, the adsorption means and the string clip were released. When the liquid traveled back and reach the mark line, the time that the liquid traveled between the mark lines was measured with the stopwatch. The aforesaid measurement was performed for three times; and an average value thereof was obtained.

For the experimental group, 0.49 g of 20 wt % polymer solution was placed into 50 mL flask equipped with a stir, and then 20 mL dimethyl acetamide was added therein. After stirring for 10 min, the time that the liquid traveled between the mark lines was measured by Ubbelohde viscometer for three times; and an average value thereof was obtained. The dynamic viscosity η was calculated by the following equation.

$$\eta[dL/g]=(\ln(\text{Time of the experimental group})/(\text{Time of the control group}))/\text{solid content (\%)}\times 0.2$$

[Elasticity]

The film of the resin composition prepared by the aforementioned method was cut into 100×100 mm$^2$, placed in the hot air circulation oven at 180° C., and cured at 185° C. for 60 min. The cured film was cut into 10×100 mm$^2$, and then the PET support film was released to obtain a specimen. The tensile modulus of the specimen was measured by Autograph AG S-5kND (Shimadzu corporation) at 20 mm/min.

[Flexibility]

100×100 mm$^2$ Copper-foiled laminated flexible board (the thickness of the Cu foil/the thickness of the insulating layer=12/12 μm) was prepared; and then the insulating matrix of the dry film was laminated on the Cu foil of the Copper-foiled laminated flexible board to obtain a substrate for evaluating flexibility. Next, a lamination was performed under vacuum, at 80° C. and 0.5 MPa for 60 sec. Then, the PET support film was released. The obtained substrate was placed in the hot air circulation oven, and cured at 185° C. for 60 min. The cured substrate was cut into 10×20 mm$^2$ specimens. The specimen was bent 180 degree bend for one time, placed in the middle of 2 mm gap of a balance. The restoring force of the bent specimen was measured. The aforementioned process was performed for 5 times, and an average value thereof was obtained.

[Chemical Resistance]

The substrate laminated with the insulating matrix identical to the substrate for the flexibility measurement was prepared, and cut into 20 mm×20 mm to obtain specimens. The specimens were placed in 1 mol % NaOH aqueous solution, 1 mol % HCl aqueous solution, 1 mol % H$_2$SO$_4$ aqueous solution, MEK and ethanol, and immersed at 30° C. for 7 days. Then, the specimens were washed with water, and dried with clean cloth. The appearance changes such as color changes and swelling of the specimens were observed with naked eyes. No appearance change was "qualified" and observing appearance change was "unqualified".

[Adhesion]

120×100 mm$^2$ Copper-foiled laminated flexible board (the thickness of the Cu foil/the thickness of the insulating layer=12/12 μm) was prepared; and then the insulating matrix of the dry film was laminated on the Cu foil of the Copper-foiled laminated flexible board to obtain a substrate. Next, a lamination was performed under vacuum, at 80° C. and 0.5 MPa for 60 sec. Then, the PET support film was released. The obtained substrate was placed in the hot air circulation oven, and cured at 185° C. for 60 min. Next, 120×100 mm$^2$ Copper-foiled laminated flexible board (the thickness of the Cu foil/the thickness of the insulating layer=12/12 μm) was further laminated on the insulating matrix of the substrate; and the obtained substrate was laminated under vacuum, at 80° C. and 0.5 MPa for 60 sec and then placed in the hot air circulation oven, and cured at 185° C. for 60 min. After the aforementioned process, a specimen was obtained. For evaluating the adhesion, the adhesion part of the specimen was peeled off with a blade, and the strength thereof was measured at 180° peeling angle and 50 mm/min peeling speed. The aforementioned test was performed for 5 times, and an average value thereof was obtained.

[Welding Thermal Resistance]

The substrate laminated with the insulating matrix identical to the substrate for the flexibility measurement was prepared, and cut into 20 mm×20 mm to obtain specimens. The specimens were floated on the surface of the 260° C. soldering tank, and the insulating matrix thereof contacted the surface of the soldering tank. The appearance changes such as color changes and swelling of the specimens were observed with naked eyes. The aforementioned test was performed for 5 times. No appearance change among these 5 times was "qualified" and the rests were "unqualified".

Preparation of Resin Composition

Embodiment 1

880.4 g DMAc (dimethyl acetamide), 474.1 g xylene, 157.1 g (0.155 mol) RT-1000 and 95.5 g (0.232 mol) p-BAPP were weighted and added into 2000 ml 5-neck separately flask. After stirring for 10 min, 100.0 g (0.322 mol) ODPA was added therein. Molar ratio of the carboxylic dianhydride compound to the diamine compound was 1:1.2. Next, the temperature of the oil was raised to 180° C.; and water was condensed through Dean-Stark apparatus, evaporated and released out the reaction system. The condensation reaction was performed for about 5 hr, and stopped until no water was released. Finally, the reaction temperature was reduced to room temperature, and long chain diamine was obtained.

Next, 5.7 g MDI (0.023 mol, the molar ratio of NCO to NH was 0.35) was dissolved in MEK, wherein the weight of MEK was 5 times of MDI. At room temperature, the solution of the long chain diamine was slowly added therein within 1 hr. The resulted solution was heated to 100° C. and the reaction was performed for 5 hr. The dynamic viscosity ($\eta$) of the obtained cross-linked polymer was 0.82. 35.8 g N-695DMAc solution (50%) and 17.9 g of 828, 5.0 g cyano amine, 15.0 g FPB-100 and 75.0 g H-42ST was added into the cross-linked polymer. The mixture was mixed with the muller, and finely dispersed by the sander provided by Weblande Corp. Fineness gauge was used to confirm no particle with diameters of 10 μm or more present. Then, 5.0 g HXA-4922HP and 4.5 g KBM-403 were added therein and mixed, to obtain the varnish for forming the dry film.

Embodiment 2

903.7 g N-methylpyrrolidone (NMP), 602.5 g mesitylene, 97.7 g (0.096 mol) RT-1000, 51.5 g (0.100 mol) dimer diamine P-1074 and 147.1 g (0.358 mol) p-BAPP were weighted and added into 2000 ml 5-neck separately flask. After stirring for 10 min, 100.0 g (0.4585 mol) PMDA was added therein. Molar ratio of the carboxylic dianhydride compound to the diamine compound was 1:1.2. The imidization reaction identical to that of Embodiment 1 was performed to obtain long chain diamine Next, similar to Embodiment 1, 8.0 g MDI (0.032 mol, the molar ratio of NCO to NH was 0.34) was dissolved in MEK, wherein the weight of MEK was 5 times of MDI; and the obtained cross-linked polymer has $\eta$ of 0.92. Finally, 4.0 g KBM-403 was added into the cross-linked polymer; and then the varnish for forming the dry film was obtained after stirring.

Embodiment 3

1037.9 g DMAc, 558.9 g xylene, 181.2 g (0.179 mol) RT-1000 and 136.4 g (0.332 mol) p-BAPP were weighted and added into 2000 ml 5-neck separately flask. After stirring for 10 min, 100.0 g (0.340 mol) BPDA was added therein. Molar ratio of the carboxylic dianhydride compound to the diamine compound was 1:1.5. The imidization reaction identical to that of Embodiment 1 was performed to obtain long chain diamine Next, similar to Embodiment 1, 10.6 g MDI (0.043 mol, the molar ratio of NCO to NH was 0.25) was dissolved in MEK, wherein the weight of MEK was 5 times of MDI; and the obtained cross-linked polymer has $\eta$ of 1.01. Finally, 4.3 g KBM-403 was added into the cross-linked polymer; and then the varnish for forming the dry film was obtained after stirring.

Embodiment 4

1271.9 g DMAc, 684.8 g xylene, 307.1 g (0.303 mol) RT-1000 and 101.8 g (0.248 mol) p-BAPP were weighted and added into 2000 ml 5-neck separately flask. After stirring for 10 min, 100.0 g (0.459 mol) PMDA was added therein. Molar ratio of the carboxylic dianhydride compound to the diamine compound was 1:1.2. The imidization reaction identical to that of Embodiment 1 was performed to obtain long chain diamine Next, similar to Embodiment 1, 8.0 g MDI (0.032 mol, the molar ratio of NCO to NH was 0.35) was dissolved in MEK, wherein the weight of MEK was 5 times of MDI; and the obtained cross-linked polymer has $\eta$ of 1.10. 5.2 g KBM-403 was added into the cross-linked polymer; and then the varnish for forming the dry film was obtained after stirring.

Embodiment 5

726.8 g NMP, 484.6 g mesitylene, 160.3 g (0.158 mol) RT-1000 and 58.7 g (0.293 mol) ODA were weighted and added into 2000 ml 5-neck separately flask. After stirring for 10 min, 100.0 g (0.322 mol) ODPA was added therein. Molar ratio of the carboxylic dianhydride compound to the diamine compound was 1:1.4. The imidization reaction identical to that of Embodiment 1 was performed to obtain long chain diamine Next, similar to Embodiment 1, 9.7 g MDI (0.039 mol, the molar ratio of NCO to NH was 0.3) was dissolved in MEK, wherein the weight of MEK was 5 times of MDI; and the obtained cross-linked polymer has $\eta$ of 0.91. 3.3 g KBM-403 was added into the cross-linked polymer; and then the varnish for forming the dry film was obtained after stirring.

Comparative Embodiment 1

1054.5 g NMP, 703.0 g mesitylene, 223.4 g (0.220 mol) RT-1000 and 135.8 g (0.330 mol) p-BAPP were weighted and added into 2000 ml 5-neck separately flask. After stirring for 10 min, 100.0 g (0.459 mol) PMDA was added therein. Molar ratio of the carboxylic dianhydride compound to the diamine compound was 1:1.2. The imidization reaction identical to that of Embodiment 1 was performed to obtain long chain diamine Next, similar to Embodiment 1, 2.3 g MDI (0.009 mol, the molar ratio of NCO to NH was 0.1) was dissolved in MEK, wherein the weight of MEK was 5 times of MDI; and the obtained cross-linked polymer has $\eta$ of 0.55. 4.6 g KBM-403 was added into the cross-linked polymer; and then the varnish for forming the dry film was obtained after stirring.

Comparative Embodiment 2

1125.5 g NMP, 750.4 g mesitylene, 204.8 g (0.202 mol) RT-1000, 107.9 g (0.209 mol) dimer diamine 1074 and 248.9 g (0.604 mol) p-BAPP were weighted and added into 2000 ml 5-neck separately flask. After stirring for 10 min, 100.0 g (0.4585 mol) PMDA was added therein. Molar ratio of the carboxylic dianhydride compound to the diamine compound was 1:2.2. The imidization reaction identical to that of Embodiment 1 was performed to obtain long chain diamine. Next, similar to Embodiment 1, 41.3 g MDI (0.162 mol, the molar ratio of NCO to NH was 0.3) was dissolved in MEK, wherein the weight of MEK was 5 times of MDI. Unsoluable gel product was obtained, and the target cross-linked polymer cannot be obtained.

Comparative Embodiment 3

1238.1 g DMAc, 666.6 g xylene, 382.9 g (0.378 mol) RT-1000 and 8.4 g (0.042 mol) ODA were weighted and added into 2000 ml 5-neck separately flask. After stirring for 10 min, 100.0 g (0.322 mol) ODPA was added therein. Molar ratio of the carboxylic dianhydride compound to the diamine compound was 1:1.3. The imidization reaction identical to that of Embodiment 1 was performed to obtain long chain diamine Next, similar to Embodiment 1, 7.3 g MDI (0.029 mol, the molar ratio of NCO to NH was 0.3) was dissolved in MEK, wherein the weight of MEK was 5 times of MDI; and the obtained cross-linked polymer has η of 0.41. 49.9 g N-695DMAc (50%) solution, 24.9 g of 828, 5.0 g cyano amine, 15.0 g FPB-100 and 75.0 g H-42ST was added into the cross-linked polymer. Similar to Embodiment 1, the mixture was finely dispsersed by the sander; and 5.0 g HXA-4922HP and 4.5 g KBM-403 were added therein and mixed, to obtain the varnish for forming the dry film.

TABLE 1

Listing of the used starting material

| | Manufacturer and function |
|---|---|
| 50 μm PET | FUJICO, support film |
| DMAc | DuPont, solvent |
| xylene | COSMO BIO, solvent |
| NMP | SANKYO CHEMICAL CO., LTD., solvent |
| mesitylene | Mitsubishi gas chemical company, Inc., solvent |
| ODPA | CHINATECH (Tianjin) CHEMICAL CO., LTD., carboxylic dianhydride 4,4'-Oxydiphthalic anhydride |
| BPDA | CHINATECH (Tianjin) CHEMICAL CO., LTD., carboxylic dianhydride 3,3',4,4'-Biphenyltetracarboxylic dianhydride |
| PMDA | DAICEL, carboxylic dianhydride Pyromellitic anhydride |
| RT-1000 | ELASTAMINE ® RT-1000 (Huntsuman), aliphatic polyalkylene diamine [poly(tetramethylene ether glycol)]/PPG (polypropylene glycol) copolymer |
| P-1074 | Priamine ™ 1074 (CRODA), aliphatic dimer diamine |
| p-BAPP | JinXiang Chemical, aryl diamine 2,2-Bis [4-(4-aminophenoxy)phenyl] propane |
| ODA | Changzhou Sunchem Pharmaceutical Chemical Material Co., Ltd., aryl diamine 4,4'-Oxydianiline |
| N-695 | DIC, novolac epoxy resin |
| 828 | Mitsubishi Chemical Corp., biphenol A epoxy resin |
| HXA4922HP | Asahi Kasei E-materials, hardener and hardening accelarator |
| cyandiamide | DOW Chemical, cross-linker |
| FPB-100 | Otsuka Chemical Co., Ltd., hexa(phenoxy) cyclotriphosphazene, retardant |
| H-42ST | Marutou CO., LTD. Al(OH)$_3$, retardant |
| KBM-403 | Shin-Etsu Chemical Co., Ltd, coupling agent (3-Glycidoxypropyl) trimethoxysilane |

TABLE 2

Listing of the components used in Embodiments and Comparative embodiments

| Components | Unit | Embodiment | | | | | Comparative embodiment | | |
|---|---|---|---|---|---|---|---|---|---|
| | | 1 | 2 | 3 | 4 | 5 | 1 | 2 | 3 |
| ODPA | g | 100.0 | | | | 100.0 | | | 100 |
| BPDA | g | | | 100.0 | | | | | |
| PMDA | g | | 100.0 | | 100.0 | | 100.0 | 100.0 | |
| RT-1000 | g | 157.1 | 97.7 | 207.1 | 307.1 | 160.3 | 223.4 | 204.8 | 382.9 |
| 1074 | | | 51.5 | | | | | 107.9 | |
| p-BAPP | g | 95.5 | 147.1 | 125.9 | 101.8 | | 135.8 | 248.9 | |
| ODA | g | | | | | 58.7 | | | 8.4 |
| MDI | g | 5.7 | 8.0 | 10.6 | 8 | 9.7 | 2.3 | 41.3 | 7.3 |
| mesitylene | | | 602.4 | | | 484.6 | 703.0 | 750.4 | |
| NMP | | | 903.7 | | | 726.8 | 1054.5 | 1125.5 | |
| DMAC | g | 880.4 | | 1037.9 | 1271.9 | | | | 1238.1 |
| Xylene | g | 474.1 | | 558.9 | 684.8 | | | | 666.6 |
| Total | g | 1712.8 | 1910.4 | 2040.4 | 2473.6 | 1540.1 | 2219 | 2578.8 | 2403.3 |
| NCO/NH | — | 0.35 | 0.34 | 0.25 | 0.35 | 0.3 | 0.1 | 0.3 | 0.3 |
| NH/COOH | — | 1.2 | 1.2 | 1.5 | 1.2 | 1.4 | 1.2 | 2.2 | 1.3 |
| 50% N-695 | g | 35.8 | — | — | — | — | — | — | 49.9 |
| 828 | | 17.9 | — | — | — | — | — | — | 24.9 |
| Cyano amine | g | 5.0 | — | — | — | — | — | — | 5.0 |
| HXA4922HP | g | 5.0 | — | — | — | — | — | — | 5.0 |
| FPB-100 | g | 15.0 | — | — | — | — | — | — | 15.0 |
| H-42ST | g | 75.0 | — | — | — | — | — | — | 75.0 |
| KBM-403 | g | 4.5 | 4.0 | 4.3 | 5.2 | 3.3 | 4.6 | — | 5.0 |

TABLE 3

| | | Embodiment | | | | | Comparative embodiment | | |
|---|---|---|---|---|---|---|---|---|---|
| | Unit | 1 | 2 | 3 | 4 | 5 | 1 | 2 | 3 |
| Dynamic viscosity | — | 0.82 | 0.92 | 1.01 | 1.10 | 0.91 | 0.55 | ND | 0.41 |
| Tensile modulus | Mpa | 63.6 | 40.1 | 34.8 | 38.6 | 33.3 | 23.7 | ND | 83.5 |
| Flexibility | g | 13.0 | 7.0 | 6.0 | 7.0 | 8.0 | 7.0 | ND | 11.0 |
| Chemical resistance | — | O | O | O | O | O | X | ND | X |
| Adhesion | KN/m | 1.21 | 0.96 | 0.91 | 1.02 | 0.95 | 1.24 | ND | 1.84 |
| Welding thermal resistance | — | O | O | O | O | O | X | ND | X |

O: Qualified; X: Unqulified; ND: Cannot be detected

From the results shown in Table 3, when the resin compositions provided by Embodiments 1-5 of the present invention were used as insulating matrix, excellent tensile modulus, flexibility, chemical resistance, adhesion and thermal stability can be obtained. Hence, the resin compositions of the present invention are suitable for flexible thin circuit boards or multi-layered circuit boards.

Embodiment 6

Figure 1B:
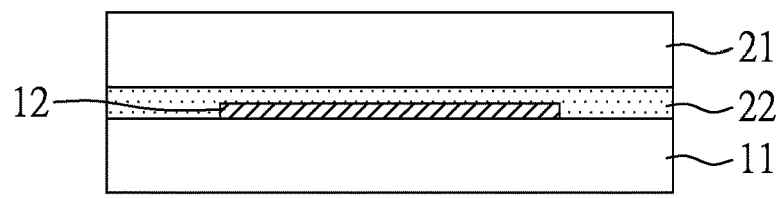
Figure 1C:
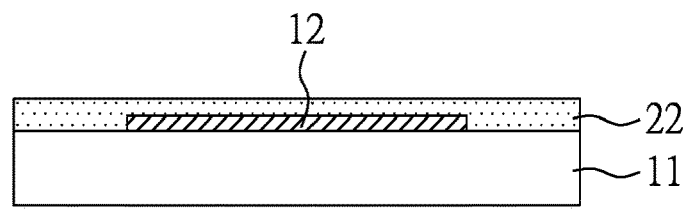

FIGS. 1A to 1C are perspective views showing a preparing process for a circuit board according to the present embodiment. As shown in FIG. 1A, a substrate 11 with a circuit layer 12 formed thereon is provided; and a support 21 with an insulating layer 22 formed thereon is also provided. Herein, the insulating layer 22 comprises one of the resin composition illustrated in the aforementioned Embodiments 1-5. Then, as shown in FIG. 1B, the support 21 is laminated on the substrate 11, and the circuit layer 12 is embedded into the insulating layer 22. Finally, as shown in FIG. 1C, the support 21 is released to obtain the circuit board of the present embodiment.

Hence, as shown in FIG. 1C, the circuit board of the present embodiment comprises: a substrate 11; and an insulating layer 22 disposed on the substrate 11 and comprising one of the resin composition illustrated in the aforementioned Embodiments 1-5. Meanwhile, the circuit board of the present embodiment further comprises: a circuit layer 12 disposed between the substrate 11 and the insulating layer 22.

In the present invention, only one possible aspect of the circuit board is provided. However, the present invention is not limited thereto; the aspects that the protection layers, the adhesion layers, the insulating layers or other layers of the circuit boards comprise the resin compositions of the present invention are within the scopes of the present invention.

Although the present invention has been explained in relation to its preferred embodiment, it is to be understood that many other possible modifications and variations can be made without departing from the spirit and scope of the invention as hereinafter claimed.

What is claimed is:

1. A resin composition, comprising:
a cross-linked polymer formed by units represented by the following formulas (1) and (2):

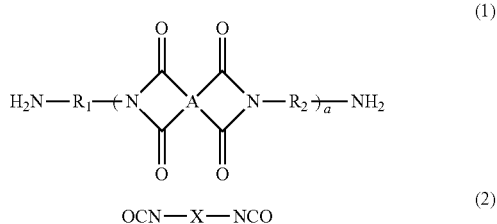

wherein,
each of $R_1$ and $R_2$ independently is a $C_{1-60}$ aliphatic group, a $C_{4-20}$ alicyclic group, a $C_{6-60}$ arylene group, a $C_{4-20}$ heterocyclic group, or a $C_{4-60}$ heteroarylene group;
A is a $C_{6-60}$ arylene group, or a $C_{4-60}$ heteroarylene group;
X is a $C_{1-60}$ aliphatic group, a $C_{4-20}$ alicyclic group, or a $C_{6-60}$ arylene group; and
a is an integral between 1 and 100,
wherein a molar ratio of the unit represented by the formula (1) to the unit represented by the formula (2) is ranged from 1:0.31 to 1:0.95; and
wherein the unit of the formula (1) is an oligomer or a polymer formed by a tetracarboxylic dianhydride monomer and a diamine monomer, and a molar ratio of the tetracarboxylic dianhydride monomer to the diamine monomer in the formula (1) is ranged from 1:1.05 to 1:1.5.

2. The resin composition of claim 1, wherein A is selected from the group consisting of:

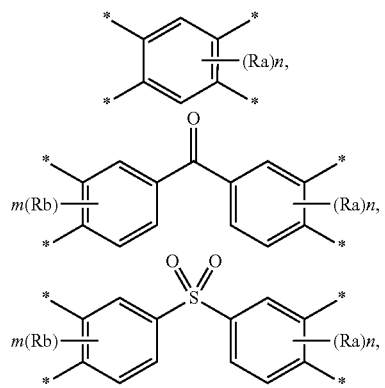

-continued

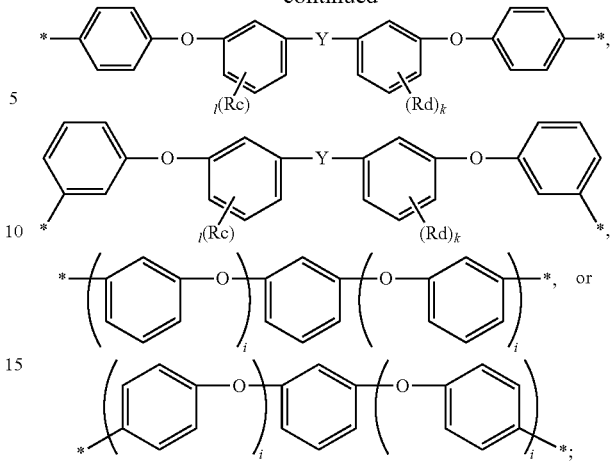

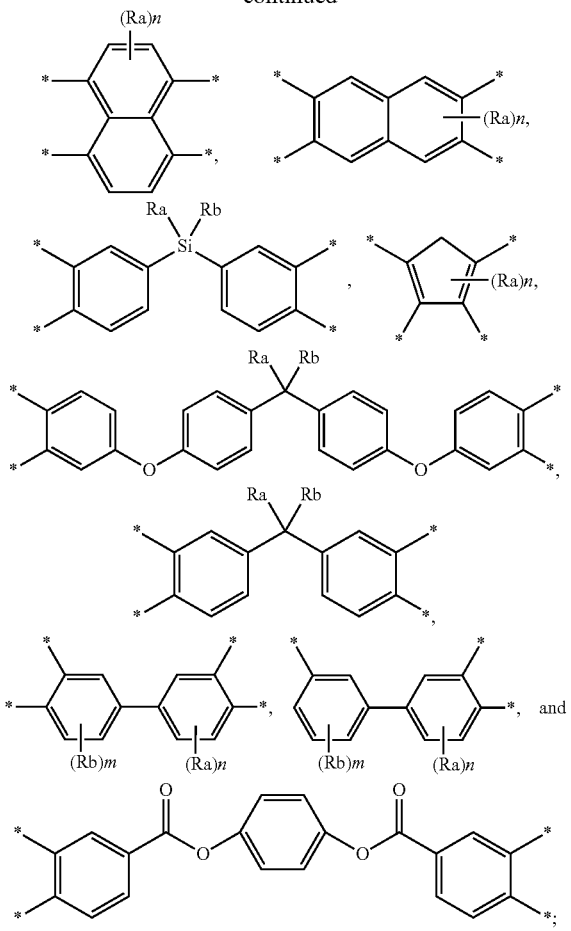

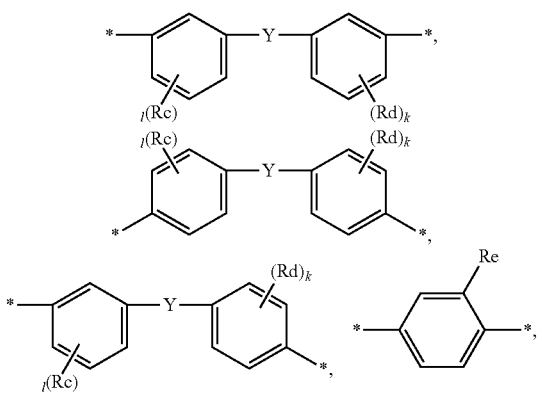

wherein, each of Ra and Rb independently is $C_{1-10}$ alkyl, $C_{2-5}$ carbalkoxy, halo, amino, $C_{3-10}$ cycloalkyl, $C_{6-10}$ aryl or $C_{5-10}$ heteroaryl;

each of m and n independently is an integral between 0 and 4; and

* represents linking positions of A.

3. The resin composition of claim 1, wherein each of $R_1$ and $R_2$ independently is $C_{1-12}$ alkylene, $C_{2-12}$ alkenylene, $C_{4-12}$ cycloalkylene, $C_{4-12}$ cycloalkenylene, wherein, Y is a direct bond, —O—, —$(CH_2)_j$—O—$(CH_2)_j$—, $C_{1-6}$ alkylene, —C(=O)—NH—, —C(=O)—, or —S(=O)$_2$—;

each of Rc and Rd independently is $C_{1-10}$ alkyl, $C_{1-10}$ alkoxy, or $C_{2-6}$ carbalkoxy;

Re is carboxyl or —C(=O)O—Rf, in which Rf is tetrahydrofurfuryl, oxyethylene, or epoxypropyl;

each of l and k independently is an integral between 0 and 4;

each of i and j independently is 1 or 2; and

* represents a position linking to N.

4. The resin composition of claim 1, wherein $R_1$ and $R_2$ are the same.

5. The resin composition of claim 1, wherein X is selected from the group consisting of $C_{4-18}$ alkylene, $C_{8-22}$ cycloalkylene, $C_{8-22}$ cycloalkenylene, $C_{6-18}$ arylene, and —($C_{1-4}$ alkylene)-$C_{6-18}$ arylene-($C_{1-4}$ alkylene)-.

6. The resin composition of claim 5, wherein the unit of the formula (2) is selected from the group consisting of toluene diisocyanate (TDI), 4,4-Methylenebis(phenyl isocyanate) (MDI), naphthyl diisocyanate (NDI), 3,3'-dimethylbiphenyl-4,4-diisocyanate (TODI), o-xylylene diisocyanate, m-xylylene diisocyanate, p-xylylene diisocyanate, tetramethylene diisocyanate, pentamethylene diisocyanate, hexamethylene diisocyanat (HDI), 2,2,4-trimethyl-1,6-diisocyanatohexane, 2,4,4-trimethyl-1,6-diisocyanatohexane, lysine methyl ester diisocyanate (LDI), isophorone diisocyanate (IPDI), 1,4-diisocyanatohexane, 1,3-bis(methyl isocyanate)-hexane, 1,4-bis(methyl isocyanate)-hexane, 1,3-bis(2-propyl isocyanate-2-yl)-hexane, 4,4-dicyclohexyl diisocyanate, norbornene dimethyl ester diisocyanate, norbornene diisocyanate, tetramethyl xylyl diisocyanate, and xylylene diisocyanate.

7. The resin composition of claim 1, wherein the tetracarboxylic dianhydride monomer is selected from the group consisting of: pyromellitic dianhydride, 3,3,4,4'-benzophenone tetracarboxylic dianhydride, 3,3,4,4'-diphenylsulfone tetracarboxylic dianhydride, 1,4,5,8-naphthalene tetracarboxylic dianhydride, 2,3,6,7-naphthalene tetracarboxylic dianhydride, 4,4'-benzenedicarboxylic anhydride, 3,3',4,4'-dimethyleter diphenylsilane tetracarboxylic dianhydride, 3,3',4,4'-tetraphenylsilane tetracarboxylic dianhydride, 1,2,3,4-furan tetracarboxylic dianhydride, 4,4'-bis(3,4-dicarboxy phenoxy)diphenyl propane dianhydride, 4,4'-hexafluoro isopropylene benzenedicarboxylic anhydride, 3,3',4,4'-biphenyltetracarboxylic dianhydride, 2,3,3',4'-biphenyltetracarboxylic dianhydride, p-pheylene(trimellitic annydride) and p-phenylenediamine phthalic anhydride.

8. The resin composition of claim 1, wherein the diamine monomer is selected from the group consisting of: 3,3'-aminodiphenyl ether, 4,4'-diamino-3,3',5,5'-tetramethyl diphenyl methane, 4,4'-diamino-3,3'-diethyl-5,5'-dimethyl diphenyl methane, 4,4'-diamino diphenyl-2,2'-propane, 4,4'-diamino diphenyl methane, 3,4'-diamino benzoyl aniline, 4,4'-diamino benzoyl aniline, 3,3'-diamino benzophenone, 4,4'-diamino benzophenone, 3,3'-diethyl-4,4'-diamino diphenylether, 3,3'-diethoxy-4,4'-diamino diphenyl methane, 3,3'-dimethyl ester-4,4'-diamino diphenyl methane, 3,3'-dimethyl ester-4,4'-diamino diphenyl propane, 3,3'-diethyl-4,4'-diamino diphenyl propane, 3,3'-dimethyl ester-5,5'-diethyl-4,4'-diamino diphenyl methane, 3,3'-dimethoxy-4,4'-diamino diphenylether, 3,3'-dimethoxy-4,4'-diamino diphenyl methane, 3,3'-dimethoxy-4,4'-diamino diphenylsulfone, 3,3'-dimethoxy-4,4'-diamino diphenyl propane, 3,3'-diethoxy-4,4'-diamino diphenyl propane, 3,3',5,5'-tetraethyl-4,4'-diamino diphenyl methane, polytetrahydrofurandi-P-amino benzoic acid, poly(ethylene oxide)-di-p-amino benzoic acid, poly(propylene oxide)-di-p-amino benzoic acid, 4,4'-bis(3-amino phenoxy)biphenyl, 4,4'-bis(4-amino phenoxy)biphenyl, 1,3-bis(3-amino phenozy)benzene, 1,3-bis(4-amino phenoxy)benzene, 1,4-bis(4-amino phenoxy)benzene, 1,3-bis[3-(amino phenoxy)phenoxy]benzene, bis[4-(4-amino phenoxy)phenyl]ether, and 2,2'-bis[4-(4-amino phenoxy)phenyl]propane.

9. The resin composition of claim 1, wherein a content of the unit of the formula (1) is 20-90 wt % based on a total molecular weight of the cross-linked polymer and a tensile modulus of the cross-linked polymer is 0.1-2.0 GPa at room temperature, when each of $R_1$ and $R_2$ independently is a $C_{1-60}$ aliphatic group.

10. The resin composition of claim 1, wherein a content of the unit of the formula (1) is 10-80 wt % based on a total molecular weight of the cross-linked polymer and a tensile modulus of the cross-linked polymer is 0.1-2.0 GPa at room temperature, when each of $R_1$ and $R_2$ independently is a $C_{6-60}$ arylene group.

11. The resin composition of claim 1, wherein the cross-linked polymer further comprises a repeated unit derived from dimer diamine.

12. The resin composition of claim 11, wherein the dimer diamine is selected from the group consisting of: polyoxyethylene bis(amine), polyoxypropylene bis(amine), polyoxybutylene bis(amine), a block copolymer of polyethylene glycol and polyoxyethylene bis(amine), a block copolymer of polyethylene glycol and poly(diamine tetramethylene glycol), a block copolymer of polypropylene glycol diamine and polybutylene glycol diamine, and a block copolymer of polyethylene glycol diamine, polypropylene glycol diamine and polybutylene glycol diamine.

13. An insulating matrix, comprising a resin composition, wherein the resin composition comprises:
a cross-linked polymer formed by units represented by the following formulas (1) and (2):

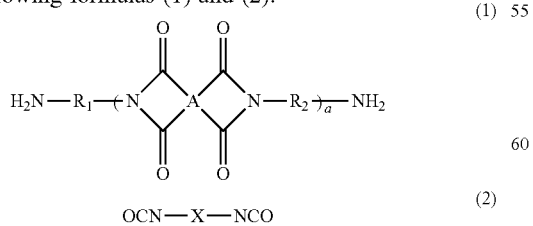

(1)

OCN—X—NCO (2)

wherein,
each of $R_1$ and $R_2$ independently is a $C_{1-60}$ aliphatic group, a $C_{4-20}$ alicyclic group, a $C_{6-60}$ arylene group, a $C_{4-20}$ heterocyclic group, or a $C_{4-60}$ heteroarylene group;
A is a $C_{6-60}$ arylene group, or a $C_{4-60}$ heteroarylene group;
X is a $C_{1-60}$ aliphatic group, a $C_{4-20}$ alicyclic group, or a $C_{6-60}$ arylene group; and
a is an integral between 1 and 100,
wherein a molar ratio of the unit represented by the formula (1) to the unit represented by the formula (2) is ranged from 1:0.31 to 1:0.95; and
wherein the unit of the formula (1) is an oligomer or a polymer formed by a tetracarboxylic dianhydride monomer and a diamine monomer, and a molar ratio of the tetracarboxylic dianhydride monomer to the diamine monomer in the formula (1) is ranged from 1:1.05 to 1:1.5.

14. A circuit board, comprising:
a substrate; and
an insulating layer disposed on the substrate and comprising a resin composition, wherein the resin composition comprises:
a cross-linked polymer formed by units represented by the following formulas (1) and (2):

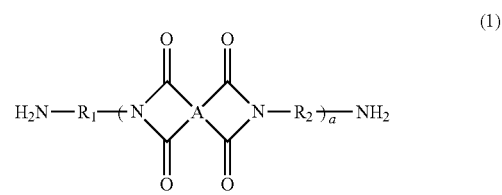

(1)

(2)

wherein,
each of $R_1$ and $R_2$ independently is a $C_{1-60}$ aliphatic group, a $C_{4-20}$ alicyclic group, a $C_{6-60}$ arylene group, a $C_{4-20}$ heterocyclic group, or a $C_{4-60}$ heteroarylene group;
A is a $C_{6-60}$ arylene group, or a $C_{4-60}$ heteroarylene group;
X is a $C_{1-60}$ aliphatic group, a $C_{4-20}$ alicyclic group, or a $C_{6-60}$ arylene group; and
a is an integral between 1 and 100,
wherein a molar ratio of the unit represented by the formula (1) to the unit represented by the formula (2) is ranged from 1:0.31 to 1:0.95; and
wherein the unit of the formula (1) is an oligomer or a polymer formed by a tetracarboxylic dianhydride monomer and a diamine monomer, and a molar ratio of the tetracarboxylic dianhydride monomer to the diamine monomer in the formula (1) is ranged from 1:1.05 to 1:1.5.

15. The circuit board of claim 14, further comprising: a circuit layer disposed between the substrate and the insulating layer.

* * * * *